United States Patent
Jin

(10) Patent No.: US 10,073,290 B2
(45) Date of Patent: Sep. 11, 2018

(54) DISPLAY DEVICE AND METHOD OF MANUFACTURING THE SAME

(71) Applicant: SAMSUNG DISPLAY CO., LTD., Yongin-si, Gyeonggi-Do (KR)

(72) Inventor: Kyongbin Jin, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 46 days.

(21) Appl. No.: 14/920,909

(22) Filed: Oct. 23, 2015

(65) Prior Publication Data

US 2016/0216552 A1    Jul. 28, 2016

(30) Foreign Application Priority Data

Jan. 28, 2015   (KR) .................. 10-2015-0013640

(51) Int. Cl.
*G02F 1/1335*   (2006.01)
*H01L 27/32*   (2006.01)
(Continued)

(52) U.S. Cl.
CPC ........ *G02F 1/133512* (2013.01); *B41F 17/00* (2013.01); *H01L 51/5237* (2013.01);
(Continued)

(58) Field of Classification Search
CPC ............. G02F 1/1335; G02F 1/133509; G02F 1/133512; G02F 1/133514; G02F 1/13394;
(Continued)

(56) References Cited

U.S. PATENT DOCUMENTS

2012/0162106 A1*  6/2012  Choi ................... G06F 1/1626
                                                    345/173
2013/0082961 A1*  4/2013  Wang .................... G06F 3/044
                                                    345/173
(Continued)

FOREIGN PATENT DOCUMENTS

JP          2015005049 A  *  1/2015
KR    10-2012-0006175 A      1/2012
(Continued)

OTHER PUBLICATIONS

English Translation of JP2015-005049 document.*

*Primary Examiner* — Bumsuk Won
*Assistant Examiner* — Ephrem Mebrahtu
(74) *Attorney, Agent, or Firm* — Lee & Morse, P.C.

(57) ABSTRACT

A display device includes a window panel over a display panel. The window panel includes a display area to transmit an image generated by the display panel and a non-display area adjacent the display area. The window panel includes a first light-shielding printed layer and first to third decor printed layers. The first light-shielding printed layer is in the non-display area. The first decor printed layer is in the non-display area and covers a side surface of the first light-shielding printed layer and at least a portion of an upper surface of the first light-shielding printed layer. The second decor printed layer is on the first light-shielding printed layer and the first decor printed layer. The second light-shielding printed layer is on the first light-shielding printed layer and the second decor printed layer.

20 Claims, 8 Drawing Sheets

(51) Int. Cl.
*H01L 51/52* (2006.01)
*B41F 17/00* (2006.01)
*G02F 1/1333* (2006.01)

(52) U.S. Cl.
CPC ...... *H01L 51/5246* (2013.01); *H01L 51/5281* (2013.01); *G02F 2001/133388* (2013.01); *H01L 27/326* (2013.01); *H01L 27/3244* (2013.01)

(58) Field of Classification Search
CPC ......... G02F 1/133528; G02F 1/133516; G02F 2001/133388; H01L 51/52; H01L 51/5237; H01L 51/524; H01L 51/5246; H01L 51/5271; H01L 51/5281; H01L 51/5284; H01L 27/3246; H01L 27/3272; H01L 27/323; H01L 27/3213; H01L 27/3276; H01L 27/322; H01L 27/3258; H01L 27/3267; H01L 27/124; H01L 27/3244

See application file for complete search history.

(56) References Cited

U.S. PATENT DOCUMENTS

| | | | |
|---|---|---|---|
| 2013/0223836 A1 | 8/2013 | Gibbs et al. | |
| 2014/0153100 A1 | 6/2014 | Yi | |
| 2014/0300835 A1* | 10/2014 | Chu | G06F 3/0412 349/12 |
| 2015/0070794 A1* | 3/2015 | Wu | G06F 1/1692 359/838 |
| 2016/0011704 A1* | 1/2016 | Chiu | G06F 1/1643 345/173 |

FOREIGN PATENT DOCUMENTS

| | | |
|---|---|---|
| KR | 10-2012-0075103 A | 7/2012 |
| KR | 10-2014-0071093 A | 6/2014 |

\* cited by examiner

DISPLAY DEVICE AND METHOD OF MANUFACTURING THE SAME

CROSS-REFERENCE TO RELATED APPLICATION

Korean Patent Application No. 10-2015-0013640, filed on Jan. 28, 2015, and entitled, "Display Device and Method of Manufacturing the Same," is incorporated by reference herein in its entirety.

BACKGROUND

1. Field

One or more embodiments described herein relate to a display device and a method for manufacturing a display device.

2. Description of the Related Art

A variety of flat panel displays have been developed. Examples include liquid crystal displays (LCDs) and organic light emitting diode (OLED) displays. These displays have a plurality of pairs of electric field generating electrodes with intervening electro-optical active layers. The electro-optical active layer in an LCD display is a liquid crystal layer. The electro-optical active layer in an OLED display is an organic light emitting layer. These and other displays have a window panel above a display panel. The window panel serves to protect the display panel.

SUMMARY

In accordance with one or more embodiments, a display device includes a display panel to display an image; and a window panel over the display panel and including a display area to transmit the image and a non-display area adjacent the display area, wherein the window panel includes: a substrate; a first light-shielding printed layer on the substrate in the non-display area; a first decor printed layer on the substrate in the non-display area and covering a side surface of the first light-shielding printed layer and at least a portion of an upper surface of the first light-shielding printed layer; a second decor printed layer on the first light-shielding printed layer and first decor printed layer; and a second light-shielding printed layer on the first light-shielding printed layer and second decor printed layer.

The first light-shielding printed layer and the first decor printed layer may be on a same layer. A height of the first decor printed layer may be greater than a height of the first light-shielding printed layer. The second decor printed layer may be on a portion of the upper surface of the first light-shielding printed layer and a portion of a side surface of the first decor printed layer. The second light-shielding printed layer may cover a side surface of the second decor printed layer. The second light-shielding printed layer may cover a portion of an upper surface of the second decor printed layer and a portion of the upper surface of the first light-shielding printed layer.

The second decor printed layer may include a first design layer on the first decor printed layer and the first light-shielding printed layer; a second design layer on the first design layer; and a third design layer on the second design layer. A width of the first design layer may be greater than a width of the second design layer, and the width of the second design layer may be greater than a width of the third design layer.

The first design layer may be closer to the display area than the second design layer, and the second design layer may be closer to the display area than the third design layer. The first, second, and third design layers may have a same color different from black. The first decor printed layer may include a pearlescent pigment and has a transparent color.

In accordance with one or more other embodiments, a method of manufacturing a display device includes providing a window panel including a non-display area adjacent to a display area; forming a first light-shielding printed layer on the window substrate in the non-display area; forming a first decor printed layer on the window substrate to cover a side surface of the first light-shielding printed layer and at least a portion of an upper surface of the first light-shielding printed layer, in the non-display area; forming a second decor printed layer on the first light-shielding printed layer and the first decor printed layer; and forming a second light-shielding printed layer on the first light-shielding printed layer and the second decor printed layer.

A height of the first decor printed layer may be greater than a height of the first light-shielding printed layer. The second light-shielding printed layer may cover a side surface of the second decor printed layer. The second light-shielding printed layer may cover a portion of an upper surface of the second decor printed layer and a portion of the upper surface of the first light-shielding printed layer.

Forming the second decor printed layer may include forming a first design layer on the first decor printed layer and the first light-shielding printed layer; forming a second design layer on the first design layer; and forming a third design layer on the second design layer. A width of the first design layer may be greater than a width of the second design layer, and the width of the second design layer may be greater than a width of the third design layer.

The first design layer may be closer to the display area than the second design layer, and wherein the second design layer is closer to the display area than the third design layer is to the display area. The first, second, and third design layers may have a same color different from black. The first decor printed layer may include a pearlescent pigment and has a transparent color.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
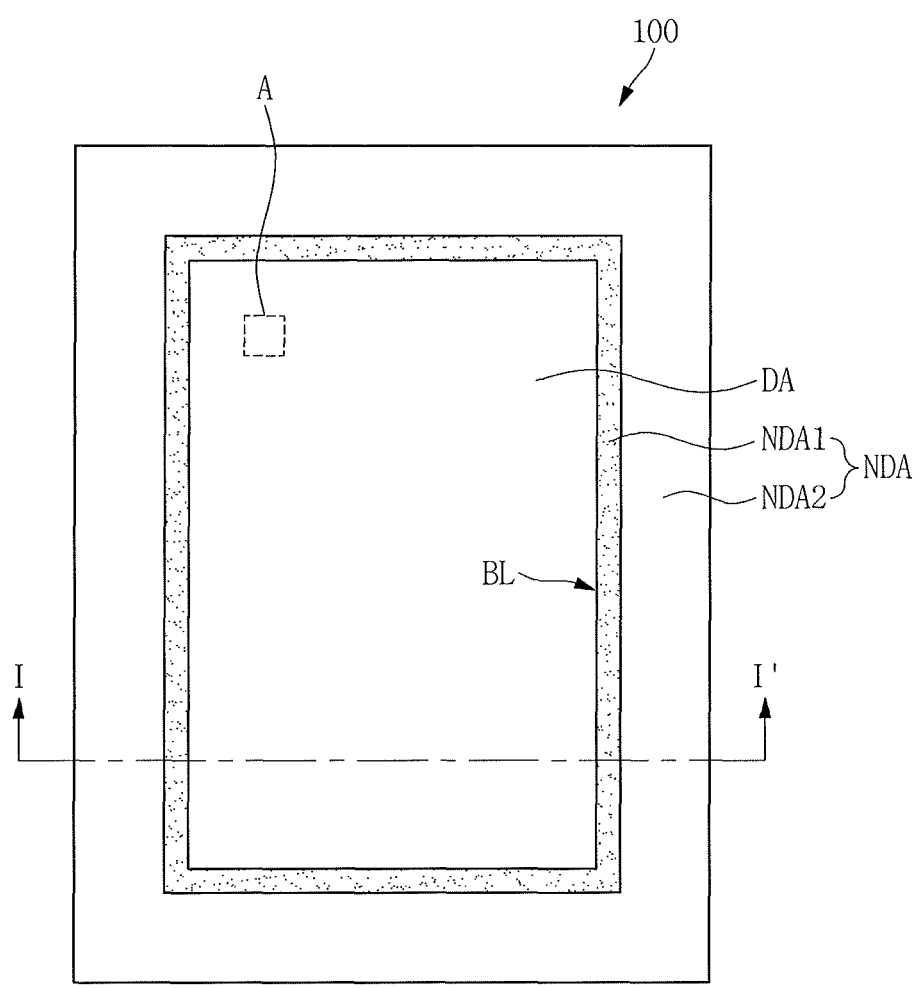
FIG. 1 illustrates an embodiment of an OLED display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the specification, when an element is referred to as being "connected" to another element, the element is "directly connected" to the other element, or "electrically connected" to the other element with one or more intervening elements interposed therebetween. As used herein, the singular forms "a," "an," and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

FIG. 1 illustrates an embodiment of a display device 100 which includes a display area DA and a non-display area NDA formed around the display area DA. The display device may be an organic light emitting diode (OLED) display device, a liquid crystal display device, a plasma display panel device, a field emission display device, or another type of display device. For illustrative purposes only, the display device 100 will assumed to be an OLED display device in the following description.

The OLED display device 100 may be an active matrix organic light emitting diode (AMOLED) display device. The pixels in this device may, for example, a 2Tr-1 Cap structure, e.g., each pixel may have two thin film transistors (TFTs) and a single capacitor. In another embodiment, the pixel may have a different structure. As used herein, the term "pixel" refers to a minimum unit for displaying an image.

Referring to FIG. 1, the display area DA may display an image and the non-display area NDA does not display an image. In one embodiment, the area of the upper surface of the OLED display device 100 substantially corresponds to an area of an upper surface of a window panel.

The non-display area NDA includes a first non-display area NDA1 around the display area DA and a second non-display area NDA2 around the first non-display area NDA1. The first non-display area NDA1 may be printed in predetermined color, e.g., black. The second non-display area NDA2 may be printed in one or more other colors (e.g., other than black) and/or in various textures. For example, the second non-display area NDA2 may be printed in white and a pearlescent pigment may be printed thereon.

A boundary between the display area DA and the non-display area NDA may be defined by a boundary line BL. The boundary line BL may be a contact surface between the display area DA and the non-display area NDA and, for example, may correspond to the inner surface of the first non-display area NDA1.

Figure 2:
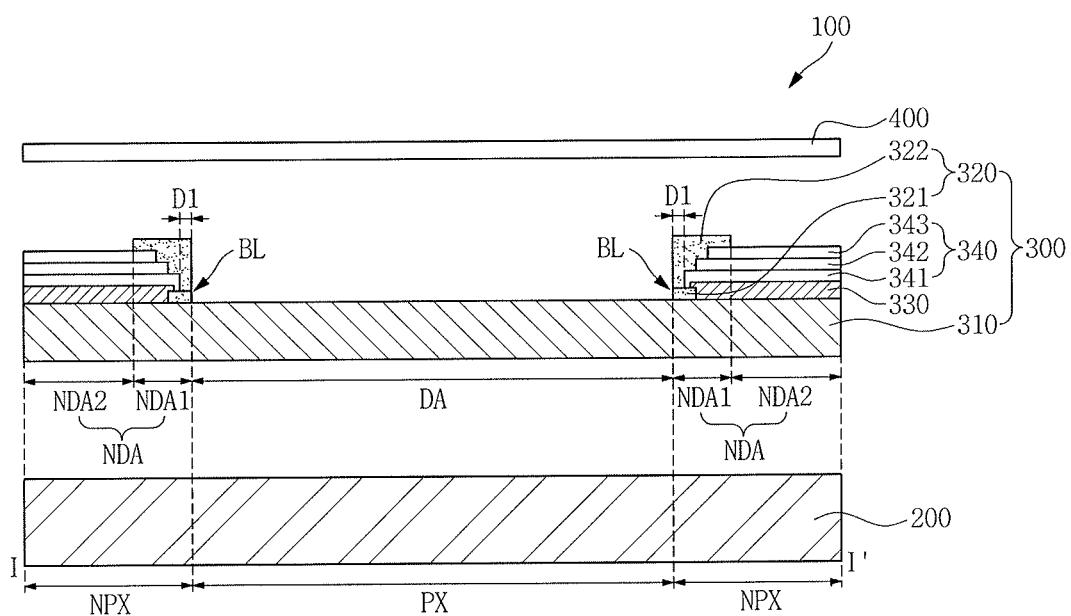
FIG. 2 illustrates a view along section line I-I' in FIG. 1.

FIG. 2 is a cross-sectional view taken along line I-I' in FIG. 1. Referring to FIG. 2, the OLED display device 100 includes a display panel 200 having a pixel area PX and a non-pixel area NPX, a window panel 300 having the display area DA and the non-display area NDA, and a protective film 400. The window panel 300 is above the display panel 200 and the protective film 400 is above the window panel 300.

The non-pixel area NPX is around the pixel area PX, and the non-display area NDA is around or adjacent to the display area DA. The pixel area PX of the display panel 200 may correspond to the display area DA of the window panel 300. The non-pixel area NPX of the display panel 200 may correspond to the non-display area NDA of the window panel 300. In FIG. 2, the display panel 200, the window panel 300, and the protective film 400 are separated from one another for ease of description.

An image is displayed in the pixel area PX but not in the non-pixel area NPX. The pixel area PX includes a plurality of pixels. The non-pixel area NPX includes a driving unit for driving the pixels. The pixels may be driven by the driving unit to generate a predetermined image.

The window panel 300 includes a window substrate 310, a light-shielding printed layer 320, a first decor printed layer 330, and a second decor printed layer 340. As described above, the non-display area NDA includes the first non-display area NDA1 around the display area DA and the second non-display area NDA2 around the first non-display area NDA1. The window substrate 310 may be transparent for transmitting light therethrough.

The light-shielding printed layer 320, the first decor printed layer 330, and the second decor printed layer 340 may be formed on the window substrate 310 in the non-display area NDA. The light-shielding printed layer 320 may be formed in the first non-display area NDA1. The boundary between the display area DA and the non-display area NDA may be set on an inner surface of the light-shielding printed layer 320. For example, the boundary line BL may be defined as the boundary between the display area DA and the non-display area NDA and may correspond to the inner surface of the light-shielding printed layer 320.

The light-shielding printed layer 320 may include a first light-shielding printed layer 321 and a second light-shielding printed layer 322. The first and second light-shielding printed layers 321 and 322 may be in non-display area NDA.

The first and second decor printed layers 330 and 340 may be on the window substrate 310 in a portion of the first non-display area NDA1 and in the second non-display area NDA2. The first and second decor printed layers 330 and 340 may be spaced from the boundary line BL at predetermined intervals, respectively. The first light-shielding printed layer 321, the second light-shielding printed layer 322, the first decor printed layer 330, and the second decor printed layer 340 may be provided in a stacked structure.

The first light-shielding printed layer 321 may be on the window substrate 310 in the first non-display area NDA1. The first light-shielding printed layer 321 and the first decor printed layer 330 may be on the same layer.

The first decor printed layer 330 may have a height greater than a height of the first light-shielding printed layer 321. The first decor printed layer 330 may cover a side surface of the first light-shielding printed layer 321 and at least a portion of an upper surface of the first light-shielding printed layer 321.

The second decor printed layer 340 may be on the first light-shielding printed layer 321 and the first decor printed layer 330. For example, the second decor printed layer 340 may be on a portion of the upper surface of the first light-shielding printed layer 321, and a portion of a side surface of the first decor printed layer 330. In addition, the second decor printed layer 340 may cover an upper surface of the first decor printed layer 330.

The second decor printed layer 340 may include a first design layer 341 on the first decor printed layer 330 and the first light-shielding printed layer 321, a second design layer 342 on the first design layer 341, and a third design layer 343 on the second design layer 342.

The width of the first design layer 341 may be greater than a width of the second design layer 342. The width of the second design layer 342 may be greater than a width of the third design layer 343. The first design layer 341 may be closer to the display area DA than the second design layer 342. The second design layer 342 may be closer to the display area DA than the third design layer 343.

The second light-shielding printed layer 322 may be on the first light-shielding printed layer 321 and the second decor printed layer 340 to cover the second decor printed layer 340 in the first non-display area NDA1. For example, the second light-shielding printed layer 322 may cover a portion of an upper surface of the second decor printed layer 340 and a portion of the upper surface of the first light-shielding printed layer 321. Further, the second light-shielding printed layer 322 may cover a side surface of the second decor printed layer 340.

The color and texture of the first light-shielding printed layer 321, the second light-shielding printed layer 322, the first decor printed layer 330, and the second decor printed layer 340 will now be described.

The first decor printed layer 330 may be a transparent printed layer. For example, the first decor printed layer 330 may be a color layer that is transparent. The first decor printed layer 330 may include a pearlescent pigment having a glittering visual effect. For example, the first decor printed layer 330 may include a pearlescent pigment in order to provide a glittering visual effect in the second non-display area NDA2 to an observer. Moreover, the first decor printed layer 330 may include a pigment representing various textures.

The second decor printed layer 340 may have a color different from the first decor printed layer 330. The first, second, and third design layers 341, 342, and 343 may have the same color other than black. For example, the colors of the first decor printed layer 330 and the second decor printed layer 340 may be different from one another. The second decor printed layer 340 may have a white color. The white color may be formed, for example, using a plurality of design layers (e.g., first, second, third design layers 341, 342, and 343) having a white color. This arrangement may more effectively represent a white color than using only the first design layer 341.

The light-shielding printed layer 320 may have a black color in the first non-display area NDA1. The light-shielding printed layer 320, having the black color, may have a light shielding rate higher than the first decor printed layer 330 and the second decor printed layer 340. Due to such a configuration, the inner surface of the light-shielding printed layer 320 may be clearly indicated by the boundary line BL.

In FIG. 2, three design layers 341, 342, and 343 are included. A different number of design layers (e.g., three or more) may be on the window substrate 310 in another embodiment.

The distance between the inner surface of the light-shielding printed layer 320 and the inner surface of the second decor printed layer 340 may be defined as a first distance value D1. For example, the distance between the boundary light BL and the inner surface of the second decor printed layer 340 may be the first distance value D1. The first distance value D1 may be set to be in a predetermined range, e.g., about 0.2 millimeters (mm) to about 0.5 mm.

The protective film 400 may include a transparent film for transmitting light. Accordingly, an image generated in the pixel area PX of the display panel 200 may pass through the display area DA of the window substrate 310, which is transparent, and the protective film 400 for viewing by an observer.

Figure 3A:
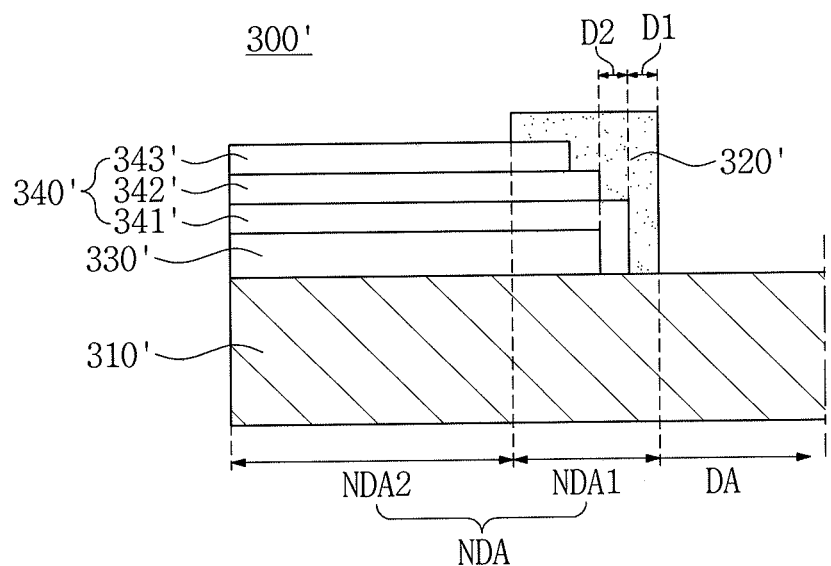
FIG. 3A illustrates a comparative example of a window panel.
Figure 3B:
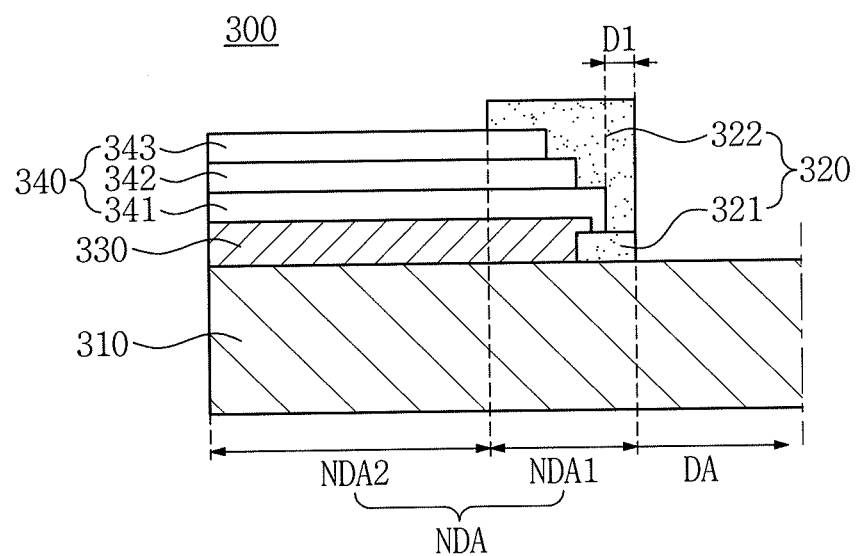
FIG. 3B illustrates a window panel in FIG. 1.

FIGS. 3A and 3B are cross-sectional views respectively illustrating a comparative example of a window panel 300' and the window panel 300 of FIG. 1.

Referring to FIG. 3A, in the window panel 300', a first decor printed layer 330' is formed on a window substrate 310'. Subsequently, first, second, and third design layers 341', 342', and 343' in the second decor printed layer 340' are sequentially stacked thereon, and a light-shielding printed layer 320' is finally stacked thereon. Such a structure has a defect, in which the second decor printed layer 340' is not only formed on an upper surface of the first decor printed layer 330', but also formed on the window substrate 310' due to the second decor printed layer 340' running down along a side surface of the first decor printed layer 330'. Thus, a portion D2 of a first non-display area NDA1 experiences an issue in which only a color is displayed therein without a texture being represented.

In the window panel 300, the first light-shielding printed layer 321 is formed on the window substrate 310, and the first decor printed layer 330 is disposed on the side surface of the first light-shielding printed layer 321 and the portion of the upper surface of the first light-shielding printed layer 321. Accordingly, even when the second decor printed layer 340 runs down along the side surface of the first decor printed layer 330, the second decor printed layer 340 may only be formed on the portion of the upper surface of the first light-shielding printed layer 321, and may not be formed directly on an upper surface of the window substrate 310. Thus, the first decor printed layer 330 and the second decor printed layer 340 may simultaneously represent color and texture at all times.

Figure 4:
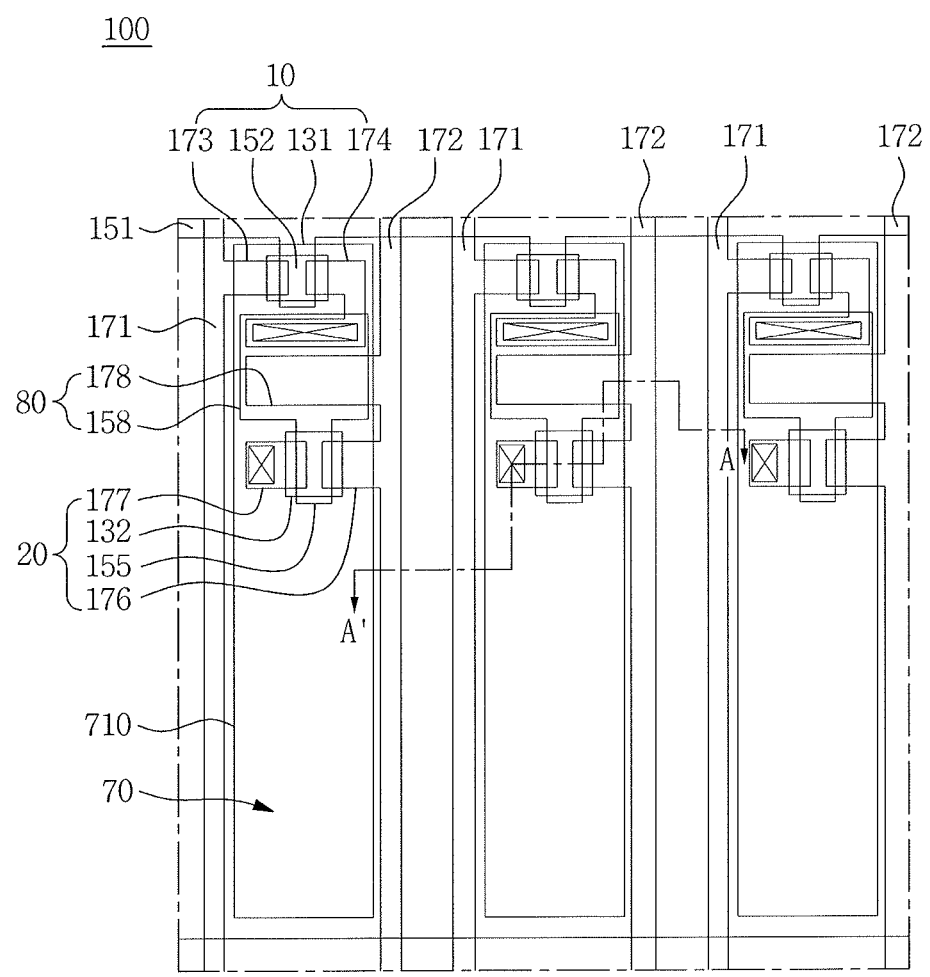
FIG. 4 illustrates an embodiment of a pixel in portion A of FIG. 1.
Figure 5:
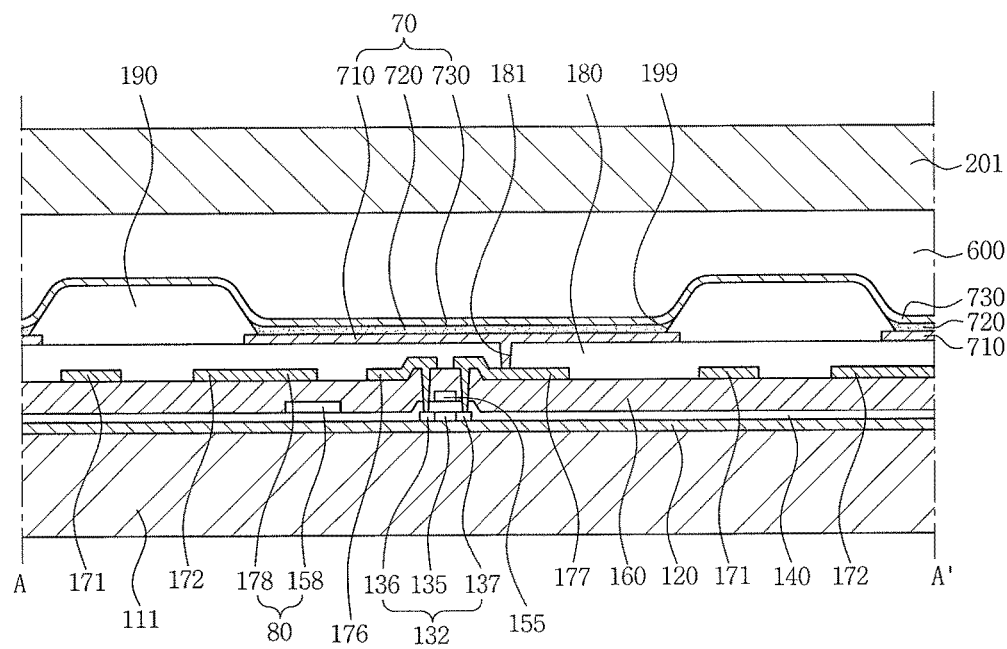
FIG. 5 illustrates a view along section line A-A' in FIG. 4.

FIG. 4 illustrates an embodiment of a pixel in portion A of FIG. 1, and FIG. 5 is a cross-sectional view taken along line A-A' in FIG. 4. Referring to FIGS. 4 and 5, AMOLED display device 100 has pixels with a 2Tr-1 Cap structure, e.g., each pixel in the display area DA in FIG. 1 has two TFTs (namely, a switching TFT 10 and a driving TFT 20) and a single capacitor 80. The pixels may have a different structure in another embodiment. For example, each pixel of the OLED display device 100 may have three or more TFTs and/or two or more capacitors and may include additional wiring. The term "pixel" refers to a minimum unit for displaying an image, and the display area includes a plurality of pixels for displaying the image.

Each pixel of the OLED display device 100 includes switching TFT 10, driving TFT 20, capacitor 80, and an OLED element 70 formed on a first substrate 111. A data line 171 and a common power line 172 intersect a gate line 151 while being insulated therefrom. Also, each pixel may be defined by a boundary among the gate line 151, the data line 171, and the common power line 172, although a different structure may be used in another embodiment.

The OLED element 70 includes a first electrode 710, an organic light emitting layer 720 on the first electrode 710, and a second electrode 730 on the organic light emitting layer 720. Since one or more first electrodes 710 may be formed on each pixel, the first substrate 111 may have a plurality of first electrodes 710 spaced apart from one another. The first electrode 710 may be an anode, a hole injection layer (HIL). The second electrode 730 may be a cathode, an electron injection layer (EIL). In another embodiment, the first electrode 710 may be a cathode and the second electrode 730 may be an anode. The electrodes may be determined, for example, based on a driving method of the OLED display device 100. In addition, the first electrode 710 may be a pixel electrode and the second electrode 730 may be a common electrode.

Holes and electrons injected into the organic light emitting layer 720 combine to form excitons. The OLED element 70 emits light based on energy generated when the excitons fall from an excited state to a ground state.

The capacitor 80 include a pair of sustaining electrodes (e.g., first and second sustaining electrodes 158 and 178) with an insulating layer 160 therebetween. The insulating interlayer 160 may be a dielectric material. The capacitance of the capacitor 80 may be determined by an amount of electric charges accumulated in the capacitor 80 and a level of a voltage between the first and second sustaining electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may be used as a switching element for selecting a pixel to emit light. The switching gate electrode 152 may be connected to the gate line 151. The switching source electrode 173 may be connected to the data line 171. The switching drain electrode 174 may be spaced apart from the switching source electrode 173 and may be connected to the first sustaining electrode 158.

The driving TFT 20 may apply driving power for emitting the organic light emitting layer 720 of the OLED element 70 within the selected pixel to the first electrode 710. The driving gate electrode 155 may be connected to the first sustaining electrode 158, which is connected to the switching drain electrode 174. The driving source electrode 176 and the second sustaining electrode 178 may be connected to the common power line 172. The driving drain electrode 177 may be connected to the first electrode 710 of the OLED element 70 through a drain contact hole 181.

In this configuration, the switching TFT 10 may be operated by a gate voltage applied to the gate line 151, to thereby transfer a data voltage applied to the data line 171 to the driving TFT 20.

A voltage, having a level equal to a difference between a level of a common voltage applied from the common power line 172 to the driving TFT 20 and a level of the data voltage transferred from the switching TFT 10, is stored in the capacitor 80. A current having a level equal to the level of the voltage stored in the capacitor 80 flows into the OLED element 70 through the driving TFT 20. As a result, the OLED element 70 emits light.

The driving TFT 20 has a stacked structure which includes the driving semiconductor layer 132, the driving gate electrode 155, the driving source electrode 176, and the driving drain electrode 177. The switching TFT 10 may have a stacked structure which includes the switching semiconductor layer 131, the switching gate electrode 152, the switching source electrode 173, and the switching drain electrode 174, a repeated description thereof will be omitted for conciseness. These stacked structures, therefore, may be similar.

In the present exemplary embodiment, the first substrate 111 may use an insulating substrate formed, for example, of glass, quartz, ceramic, plastic, or the like. The material forming the first substrate 111 may be different in another embodiment, e.g., the first substrate 111 may be a metal substrate formed, for example, of stainless steel.

The buffer layer 120 is on the first substrate 111, and serves to prevent infiltration of impure elements to the first substrate 111 and to planarize a surface of the first substrate 111. The buffer layer 120 may include various materials capable of performing the aforementioned functions. For example, the buffer layer 120 may include at least one selected from the group consisting of silicon nitride ($SiN_x$), silicon oxide ($SiO_2$), and silicon oxynitride ($SiO_xN_y$). The buffer layer 120 may be omitted in another embodiment, e.g., the buffer layer 120 may be omitted based on, for example, on the type of and/or process conditions for forming the first substrate 111.

The driving semiconductor layer 132 is on the buffer layer 120. The driving semiconductor layer 132 may include at least one semiconductor material selected from the group consisting of polycrystalline silicon, amorphous silicon, and oxide semiconductor. The driving semiconductor layer 132 may include a source region 136 and a drain region 137 doped with p-type impurities at respective sides of a channel region 135 undoped with impurities In this instance, ion materials used for doping may be p-type impurities such as boron (B), and in particular, diborane ($B_2H_6$) may be used. Such impurities may differ based on the type of the TFT.

The gate insulating layer 140 is on the driving semiconductor layer 132 and may include for example, $SiN_x$, $SiO_2$, or the like. The gate insulating layer 140 may include at least one selected from the group consisting of tetraethyl orthosilicate (TEOS), $SiN_x$, and $SiO_2$. For example, the gate insulating layer 140 may have a double-layer structure in which a $SiN_x$ layer having a thickness of about 40 nanometers (nm) and a TEOS layer having a thickness of about 80 nm are sequentially stacked. The gate insulating layer 140 may have a different structure and/or may be formed from different materials in another embodiment.

The driving gate electrode 155, the gate line 151 of FIG. 4, and the first sustaining electrode 158 are on the gate insulating layer 140. In this instance, the driving gate electrode 155 overlaps at least a portion of the driving semiconductor layer 132, and more particularly, the channel region 135. The driving gate electrode 155 may serve to block impurities from being doped in the channel region 135 at the time when impurities are doped in the source region 136 and the drain region 137 of the driving semiconductor layer 132 during the formation of the driving semiconductor layer 132.

The driving gate electrode 155 and the first sustaining electrode 158 may be on the same layer and may be formed of substantially the same metal. The metal forming the driving gate electrode 155 and the first sustaining electrode 158 may include, for example, at least one selected from the group consisting of molybdenum (Mo), chromium (Cr), and tungsten (W). In one embodiment, the driving gate electrode 155 and the first sustaining electrode 158 may be formed of Mo or an alloy including Mo.

The insulating layer 160 is on the gate insulating layer 140, with the insulating layer 160 covering the driving gate electrode 155. The insulating layer 160 may be an insulating interlayer which includes, for example, $SiN_x$, $SiO_x$, similar to that of the gate insulating layer 140. The gate insulating layer 140 and the insulating layer 160 may include respective contact holes through which the source region 136 and the drain region 137 of the driving semiconductor layer 132 are exposed.

The driving source electrode 176, the driving drain electrode 177, the data line 171, the common power line 172, and the second sustaining electrode 178 are on the insulating layer 160 in the display area DA. The driving source electrode 176 and the driving drain electrode 177 are connected to the source region 136 and the driving region 137 of the driving semiconductor layer 132 through contact holes, respectively.

The driving source electrode 176, the driving drain electrode 177, the data line 171, the common power line 172, and the second sustaining electrode 178 may include a refractory metal formed of at least one selected from the group consisting of Mo, Cr, tantalum (Ta), and titanium (Ti), or an alloy thereof, and may have a multilayer structure including the refractory metal layer and a low-resistance conductive layer. Examples of the multiplayer structure may include a double-layer structure of a Cr or Mo (or an alloy thereof) lower layer and an aluminum (Al) upper layer, and a triple-layer structure of a Mo (or an alloy thereof) lower layer, an Al (or an alloy thereof) intermediate layer, and a Mo (or an alloy thereof) upper layer.

The driving source electrode 176, the driving drain electrode 177, the data line 171, the common power line 172, and the second sustaining electrode 178 may be formed of various materials other than the aforementioned materials.

Accordingly, the driving TFT 20 is formed to include the driving semiconductor layer 132, the driving gate electrode 155, the driving source electrode 176, and the driving drain electrode 177. The driving TFT 20 may have a different structure in another embodiment.

A protective layer 180 is on the insulating interlayer 160 to cover the driving source electrode 176, the driving drain electrode 177, and the like, thereon. The protective layer 180 may include, for example, an organic material such as polyacrylate, polyimide. The protective layer 180 may be a planarization layer. In one embodiment, the protective layer 180 includes at least one selected from the group consisting of a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB).

The protective layer 180 includes the drain contact hole 181 through which the driving drain electrode 177 is exposed. The first electrode 710 may be on the protective layer 180, and may be connected to the driving drain electrode 177 through the drain contact hole 181 of the protective layer 180.

A pixel defining layer 190 is on the protective layer 180 to cover the first electrode 710 thereon. The pixel defining layer 190 may include an aperture 199 through which the first electrode 710 is exposed. For example, the first electrode 710 may correspond to the aperture 199 of the pixel defining layer 190. The pixel defining layer 190 may include, for example, a resin such as a polyacrylate resin or a polyimide resin.

In one embodiment, the pixel defining layer 190 may include a photosensitive organic material or a photosensitive polymer material. For example, the pixel defining layer 190 may include one of polyacrylate, polyimide, photosensitive polyimide (PSPI), photosensitive acryl (PA), or a photosensitive novolak resin.

The organic light emitting layer 720 is on the first electrode 710 within the aperture 199 of the pixel defining layer 190, and the second electrode 730 is on the pixel defining layer 190 and the organic light emitting layer 720.

Accordingly, the OLED element 70 is formed from the first electrode 710, the organic light emitting layer 720, and the second electrode 730.

One of the first electrode 710 or the second electrode 730 may be formed using a transparent conductive material, and the other may be formed using a transflective conductive material or a reflective conductive material. The OLED display device 100 may be a front-emission-type display device, a bottom-emission-type display device, or a double-side emission-type display device based on the type of material forming the first and second electrodes 710 and 730. For example, when the OLED display device 100 is a front-emission-type display device, the first electrode 710 may be formed of a transflective or reflective conductive material and the second electrode 730 may be formed of a transparent conductive material.

Examples of the transparent conductive material include at least one selected from the group consisting of indium-tin oxide (ITO), indium-zinc oxide (IZO), zinc oxide (ZnO), and indium oxide ($In_2O_3$). Examples of the reflective conductive material include at least one selected from the group consisting of lithium (Li), calcium (Ca), lithium fluoride/calcium (LiF/Ca), lithium fluoride/aluminum (LiF/Al), aluminum (Al), silver (Ag), magnesium (Mg), and gold (Au).

The organic light emitting layer 720 may be formed of a low molecular weight organic material or a polymer organic material. The organic light emitting layer 720 may be formed as a multilayer including at least one selected from a light emitting layer, a hole injection layer (HIL), a hole transporting layer (HTL), an electron transporting layer (ETL), and an electron injection layer (EIL). For example, the HIL may be on the first electrode 710 having a positive pole and may include the HTL, the light emitting layer, the ETL, and the EIL sequentially stacked thereon.

Although the organic light emitting layer 720 is only formed in the aperture 199 of the pixel defining layer 190 in the present exemplary embodiment, the disposition of the organic light emitting layer 720 is not limited thereto. Accordingly, at least one of the multilayers constituting the organic light emitting layer 720 may be above the first electrode 710 and between the pixel defining layer 190 and the second electrode 730, within the aperture 199 of the pixel defining layer 190. For example, the HIL, the HTL, the ETL, and the EIL of the organic light emitting layer 720 may be formed in a portion other than the aperture 199 due to an open mask. The light emitting layer of the organic light emitting layer 720 may be formed for each aperture 199 through a fine metal mask (FMM).

When the display device is to be implemented as an LCD device, the first electrode 710 may be physically and electrically connected to the driving drain electrode 177 through the drain contact hole 181. The first electrode 710 receives a data voltage from the driving drain electrode 177 and generates an electric field with the second electrode 730 (e.g., the common electrode) to which a common voltage is applied. As a result, the direction of liquid crystal molecules of a liquid crystal layer between the two electrodes (e.g., the first and second electrodes 710 and 730) is determined. The first and second electrodes 710 and 730 may constitute a capacitor (hereinafter, referred to as a "liquid crystal capacitor") and may maintain a voltage applied thereto, even subsequent to the TFT being turned off.

A second substrate 201 may be attached and sealed to the first substrate 111, with the OLED element 70 therebetween. The second substrate 201 may encapsulated and sealed to the switching TFT 10, the driving TFT 20 and the OLED element 70 on the first substrate 111 to protect the encapsulated elements from the external environment. The second substrate 201 may include an insulating substrate formed of a material such as glass or plastic. For a front-emission-type display device in which an image is displayed toward the second substrate 201, the second substrate 201 may include a light transmissive material.

A buffer material 600 may be between the first substrate 111 and the second substrate 201. The buffer material 600 may protect internal elements such as the OLED element 70 against external impact. Also, the buffer material 600 may enhance mechanical reliability of the OLED display device 100. The buffer material 600 may include at least one selected from an organic sealant (e.g., a urethane resin, an epoxy resin, and an acrylic resin) or an inorganic sealant such as silicon. The urethane resin may include, for example, urethane acrylate. The acrylic resin may include, for example, butylacrylate, or ethylhexylacrylate.

FIGS. 6A to 6G illustrate different cross-sectional stages in an embodiment of a method for manufacturing an OLED display device, which, for example, may correspond to the aforementioned embodiments.

Figure 6A:
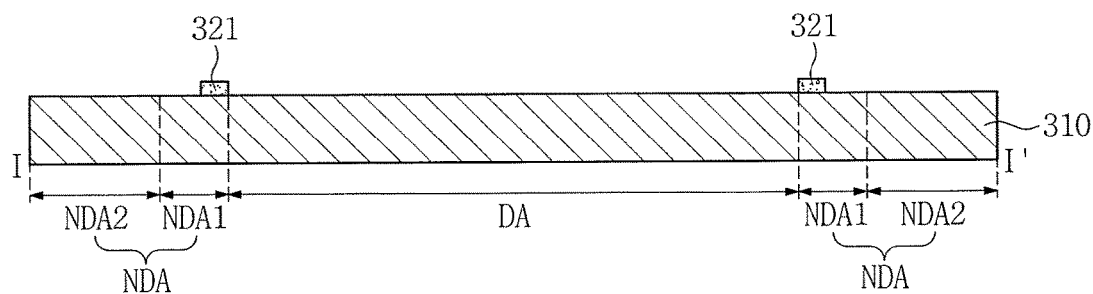
FIGS. 6A through 6G illustrate different stages of an embodiment of a method for manufacturing an OLED display device.

Referring to FIG. 6A, the method includes providing the window substrate 310 having the display area DA and the non-display area NDA, which includes the first and second non-display areas NDA1 and NDA2. The first light-shielding printed layer 321 may be formed in a portion of first non-display area NDA1 along the boundary line BL.

Figure 6B:
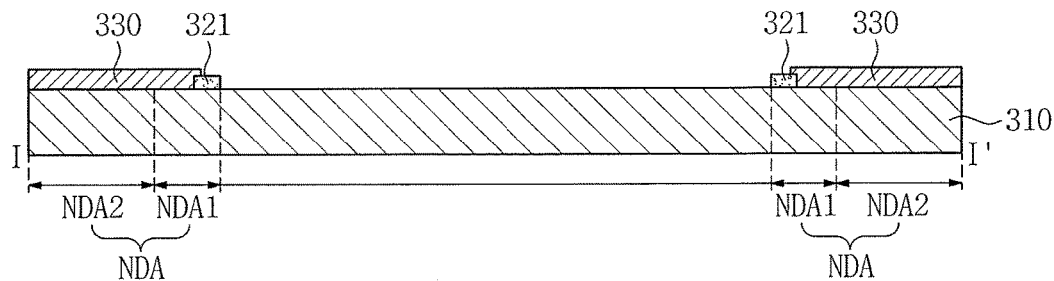

Referring to FIG. 6B, the first decor printed layer 330 is disposed on the window substrate 310 to cover the side surface of the first light-shielding printed layer 321 and at least a portion of the upper surface of the first light-shielding printed layer 321.

Figure 6C:
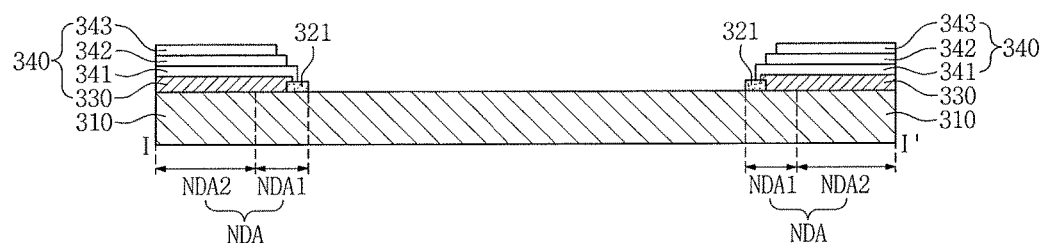

Referring to FIG. 6C, the second decor printed layer 340 is disposed on the first light-shielding printed layer 321 and the first decor printed layer 330. The second decor printed layer 340 may cover at least a portion of the upper surface of the first light-shielding printed layer 321, the upper surface of the first decor printed layer 330, and at least a portion of the side surface of the first decor printed layer 330. The first decor printed layers 330 may be spaced apart from one another at predetermined intervals, and the second decor printed layers 340 are spaced apart from one another at predetermined intervals, along a boundary between the display area DA and the non-display area NDA. Each of the first and second decor printed layers and 340 is disposed on the window substrate 310 in a portion of the first non-display area NDA1 and entirely in the second non-display area NDA2.

The first design layer 341 is disposed on the first light-shielding printed layer 321 and the first decor printed layer 330. The second design layer 342 is disposed on the first design layer 341. The second design layer 342 may have a width less than that of the first design layer 341. The third design layer 343 is disposed on the second design layer 342. The third design layer 343 may have a width less than that of the second design layer 342. The first design layer 341 is closer to the display area DA than the second design layer 342. The second design layer 342 is closer to the display area DA than the third design layer 343.

Figure 6D:
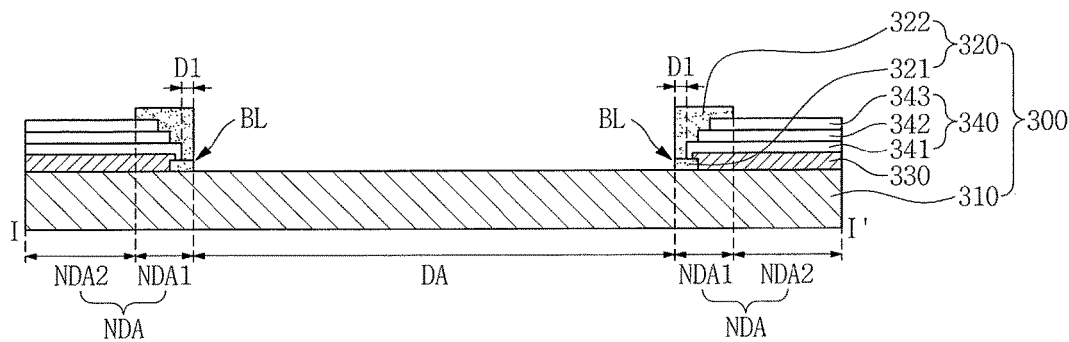

Referring to FIG. 6D, the second light-shielding printed layer 322 is disposed on the first light shielding printed layer 321 and the second decor printed layer 340. As described above, the inner surface of the light-shielding printed layer 320 may be defined as the boundary line BL. The first distance value D1 is defined by the distance between the inner surface of the light shielding printed layer 320 and the inner surface of the second decor printed layer 340, and may be in the range of, for example, about 0.2 mm to about 0.5 mm. The window panel 300 may therefore be manufactured through the operations in FIGS. 6A through 6D.

Figure 6E:
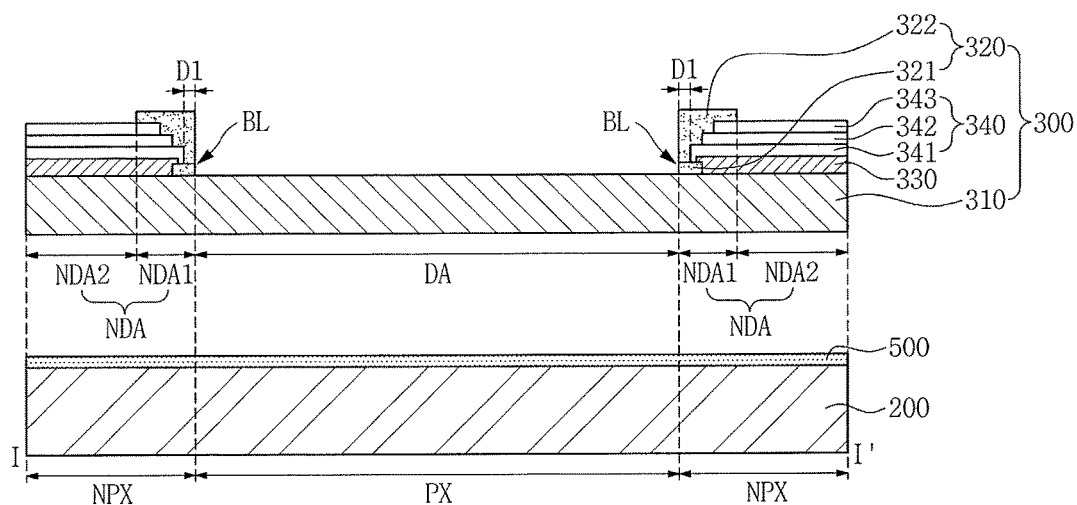

Referring to FIG. 6E, the display panel 200 may be below the window panel 300. An adhesive member 500 may be attached to an upper surface of the display panel 200. The adhesive member 500 may include, for example, an ultraviolet (UV) light curable resin.

Figure 6F:
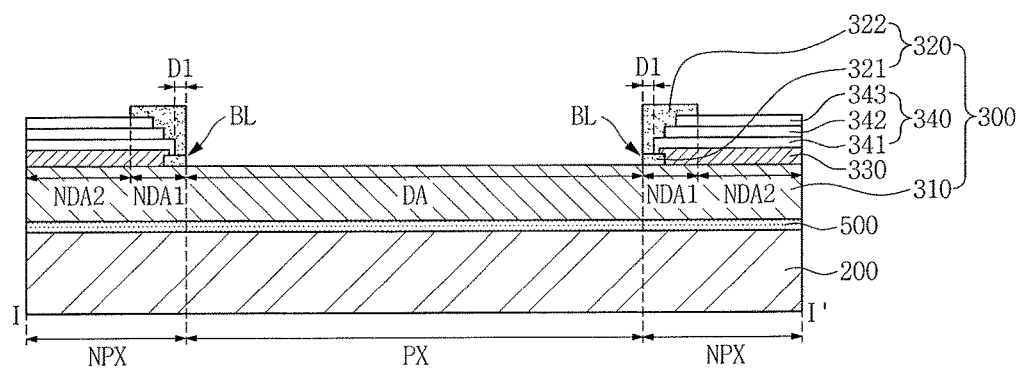
Figure 6G:
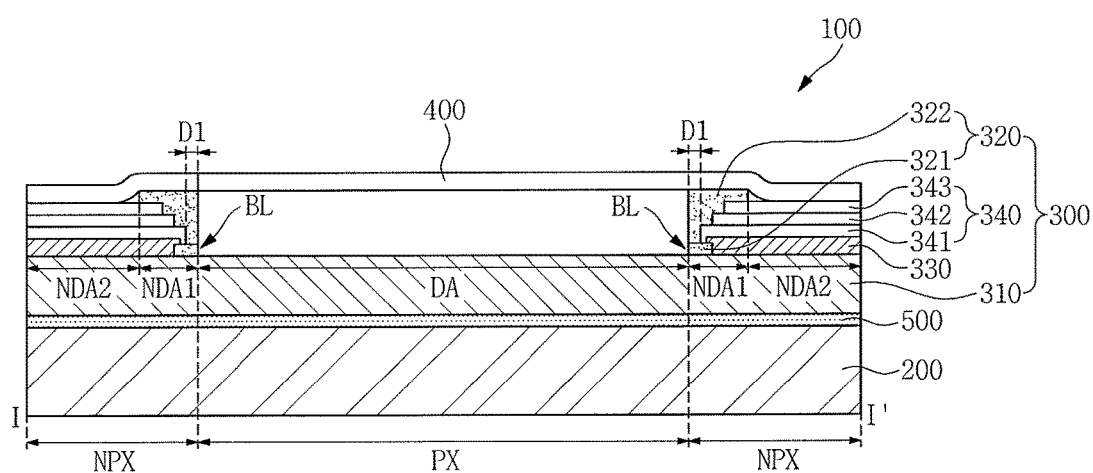

Referring to FIGS. 6F and 6G, the display panel 200 and the window panel 300 may be attached to one another with the adhesive member 500 therebetween. The adhesive member 500 may be cured by UV light, and the protective film 400 may be attached to the window panel 300.

In accordance with one or more of the aforementioned embodiments, an OLED display device simultaneously represents color and texture on a window panel, prevents printing defects (e.g., only color is represented absent texture), and clarifies the boundary between the display area and the non-display area.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A display device, comprising:
   a display panel to display an image; and
   a window panel over the display panel and including a display area to transmit the image and a non-display area adjacent the display area, wherein the window panel includes:
   a substrate;
   a first light-shielding printed layer on the susbtrate in the non-display area;
   a first decor printed layer on the substrate in the non-display area and covering a side surface of the first light-shielding printed layer and at least a portion of an upper surface of the first light-shielding printed layer;
   a second decor printed layer including a plurality of design layers on the first decor printed layer, at least one of the design layers overlapping the first light-shielding printed layer and another one of the design layers not overlapping the first light-shielding printed layer; and
   a second light-shielding printed layer on the first light-shielding printed layer and the second decor printed layer, wherein the non-display area adjacent the display area includes a first non-display area around the display area and a second non-display area around the first non-display area, and wherein the first and the second light-shielding printed layers are disposed in the first non-display area.

2. The display device as claimed in claim 1, wherein the first light-shielding printed layer and the first decor printed layer are on a same layer.

3. The display device as claimed in claim 1, wherein a height of the first decor printed layer is greater than a height of the first light-shielding printed layer.

4. The display device as claimed in claim 1, wherein the second decor printed layer is on a portion of the upper surface of the first light-shielding printed layer and a portion of a side surface of the first decor printed layer.

5. The display device as claimed in claim 1, wherein the second light-shielding printed layer covers a side surface of the second decor printed layer.

6. The display device as claimed in claim 5, wherein the second light-shielding printed layer covers a portion of an upper surface of the second decor printed layer and a portion of the upper surface of the first light-shielding printed layer.

7. The display device as claimed in claim 1, wherein the second decor printed layer includes:
 a first design layer on the first decor printed layer and the first light-shielding printed layer;
 a second design layer on the first design layer; and
 a third design layer on the second design layer.

8. The display device as claimed in claim 7, wherein:
 a width of the first design layer is greater than a width of the second design layer, and
 the width of the second design layer is greater than a width of the third design layer.

9. The display device as claimed in claim 8, wherein the first design layer is closer to the display area than the second design layer, and wherein the second design layer is closer to the display area than the third design layer.

10. The display device as claimed in claim 9, wherein the first, second, and third design layers have a same color different from black.

11. The display device as claimed in claim 1, wherein the light-shielding printed layers have a light shielding rate higher than the decor printed layers.

12. A method of manufacturing a display device, the method comprising:
 providing a window panel including a non-display area adjacent to a display area;
 forming a first light-shielding printed layer on a window substrate in the non-display area;
 forming a first decor printed layer on the window substrate to cover a side surface of the first light-shielding printed layer and at least a portion of an upper surface of the first light-shielding printed layer, in the non-display area;
 forming a second decor printed layer including a plurality of design layers on the first decor printed layer, at least one of the design layers overlapping the first light-shielding printed layer and another one of the design layers not overlapping the first light-shielding printed layer; and
 forming a second light-shielding printed layer on the first light-shielding printed layer and the second decor printed layer, wherein the non-display area adjacent the display area includes a first non-display area around the display area and a second non-display area around the first non-display area, and wherein the first and the second light-shielding printed layers are disposed in the first non-display area.

13. The method as claimed in claim 12, wherein a height of the first decor printed layer is greater than a height of the first light-shielding printed layer.

14. The method as claimed in claim 12, wherein the second light-shielding printed layer covers a side surface of the second decor printed layer.

15. The method as claimed in claim 14, wherein the second light-shielding printed layer covers a portion of an upper surface of the second decor printed layer and a portion of the upper surface of the first light-shielding printed layer.

16. The method as claimed in claim 12, wherein forming the second decor printed layer includes:
 forming a first design layer on the first decor printed layer and the first light-shielding printed layer;
 forming a second design layer on the first design layer; and
 forming a third design layer on the second design layer.

17. The method as claimed in claim 16, wherein:
 a width of the first design layer is greater than a width of the second design layer, and
 the width of the second design layer is greater than a width of the third design layer.

18. The method as claimed in claim 17, wherein the first design layer is closer to the display area than the second design layer, and wherein the second design layer is closer to the display area than the third design layer is to the display area.

19. The method as claimed in claim 18, wherein the first, second, and third design layers have a same color different from black.

20. The method as claimed in claim 12, wherein the light-shielding printed layers have a light shielding rate higher than the decor printed layers.

* * * * *